United States Patent
Cusack

(10) Patent No.: US 7,495,320 B2
(45) Date of Patent: Feb. 24, 2009

(54) SYSTEM AND METHOD FOR PROVIDING A POWER BUS IN A WIREBOND LEADFRAME PACKAGE

(75) Inventor: Michael David Cusack, Boise, ID (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 342 days.

(21) Appl. No.: 11/412,521

(22) Filed: Apr. 27, 2006

(65) Prior Publication Data

US 2007/0252245 A1    Nov. 1, 2007

(51) Int. Cl.
*H01L 23/495* (2006.01)

(52) U.S. Cl. .............. 257/666; 257/672; 257/676; 257/E23.031; 257/E23.033; 257/E23.042

(58) Field of Classification Search ......... 257/666–677, 257/E23.031–E23.059; 438/111, 112, 123, 438/FOR. 366, FOR. 367, FOR. 377, FOR. 380
See application file for complete search history.

(56) References Cited

U.S. PATENT DOCUMENTS 5,428,247 A * 6/1995 Sohn et al. .................. 257/676

* cited by examiner

*Primary Examiner*—Jasmine J Clark

(57) ABSTRACT

An integrated circuit (IC) package, such as a Quad Flat Pack (QFP), has at least one lead with a tip that extends substantially perpendicular to the ends of two or more bondwires, so that there is room for more than one bondwire to be attached to it along its length. Thus, bondwires leading from die bondpads that are not adjacent to one another can be efficiently connected to the same lead in a bus-like manner.

8 Claims, 5 Drawing Sheets

SYSTEM AND METHOD FOR PROVIDING A POWER BUS IN A WIREBOND LEADFRAME PACKAGE

BACKGROUND OF THE INVENTION

Electronic packaging is essentially the final step in the process of fabricating an integrated circuit (IC) or "chip." In the packaging step, the semiconductor die is mounted on a leadframe, and electrical connections are made between the die and the leads of the leadframe, before encapsulating the assembly in the component body. The leadframe is typically made from a thin sheet of metal by stamping or etching. The majority of IC packages use a method known as wirebonding to make the electrical connections between the die and the leads. In wirebonding, one end of a very fine gold or aluminum bondwire (on the order of 10-100 micrometers in diameter) is attached to a bondpad on the die, and the other end is attached to an end of a lead. The end of the lead to which the bondwire is attached is sometimes referred to as a bondfinger and sometimes as a lead tip. The bondwire ends are typically attached by applying some combination of pressure and heat. The resulting weld-like or solder-like attachment or bond is commonly referred to as a wirebond. The other end of the lead extends externally to the package (component body) for connection to other circuitry when the IC is used as a circuit component. This external portion of the lead may have a stepped shape or other features to facilitate mounting it to a circuit board, but such features are not relevant to the present invention.

Many common ICs, including many application-specific integrated circuits (ASICs), are in the form of a package known as a Quad Flat Pack (QFP). As illustrated in FIG. 1, a QFP package 100 has four sides with leads 102 extending from the component body 104 on all four sides. As illustrated in FIG. 2, inside a QFP package 100 the electrical connections between the die 106 and the leads 102 are made by wirebonding with bondwires 108. (Some leads 102 and other grouped elements are not shown individually for purposes of clarity, and their omission is indicated collectively by an ellipsis (" . . . ") symbol.) Typically, one wirebond (i.e., the weld-like attachment or bond) connects or attaches one bondpad 110 to one lead 102. In general, the number of bondpads 110 dictates the number of corresponding QFP leads 102. Nevertheless, in instances in which adjacent or proximate bondpads are intended to carry the same electrical signal (e.g., device ground and power), more than one bondpad may be wirebonded to a single lead. Typically, there are numerous electrically common bondpads that lie along each of the four sides of the die, such as device ground ("VSS") and core power ("VDD").

In some packages, ground bondpads are wirebonded to diepaddle 112, which is a metal plate-like portion of the leadframe underneath the die that physically supports the die and acts as an electrical ground plane. (The leadframe is the entire stamped or etched area comprising all leads 102.) The diepaddle 112 effectively combines and consolidates the ground connections from the die and redistributes ground to a number of package lead tips. A similar structure, sometimes referred to as an interposer (not shown), can be used for distributing core power. Such structures add significant manufacturing cost and increase the size and weight of the package.

The more leads in a QFP package, the greater its size, weight, cost and complexity. Thus, it would be advantageous to minimize the number of package leads. In some instances, a package for which a component manufacturer or customer indicates a preference has too few leads to accommodate the number of bondpads of the die to be packaged. In such an instance, a larger, more complex, less economical package must be selected. Note in the QFP package 100 of FIG. 2 that a few bondpads 110a, 110b and 110c cannot be accommodated and thus have been left unattached. While in this exemplary QFP package 100 it may be that bondpads 110a, 100b and 100c are not utilized by the die 106, i.e., carry no signal in operation, and thus are not to be accommodated by any leads 102, it would be desirable to provide the option of accommodating them.

It would be desirable to provide an IC package that maximizes the number of bondpads that a given number of leads can accommodate. The present invention addresses the above-described problems and deficiencies and others in the manner described below.

SUMMARY OF THE INVENTION

The present invention relates to an integrated circuit (IC) package, such as a Quad Flat Pack (QFP), in which at least one lead has a lead tip with an extended shape, extending substantially perpendicular to the ends of two or more bondwires, so that there is room for more than one bondwire to be attached to it along its length. Thus, bondwires leading from die bondpads that are not adjacent to one another can be efficiently connected to the same lead in a bus-like manner.

The elongated lead portions of leads along one edge of the package are substantially parallel to one another (and perpendicular to the package edge) as in a conventional QFP or similar package. In an exemplary embodiment of the invention, a lead tip having the extended shape and orientation described above is also substantially perpendicular to the elongated lead portion of a lead, thus defining an L-shaped lead. Nevertheless, in other embodiments the lead tip can have any suitable shape and orientation with respect to the elongated lead portion of the lead.

In some embodiments of the invention, the elongated lead tips can interconnect two or more leads, thereby defining a loop-like lead structure. For example, in an embodiment in which the lead tip is also substantially perpendicular to the elongated lead portions of two leads, a U-shaped loop-like lead structure is defined. As noted above, in other embodiments the lead tip can have any suitable shape and orientation with respect to the elongated lead portion of the lead. Lead structures (loops) can be nested, with one loop being within another loop.

Bondwires can be attached at any point along the lead tips, thereby maximizing the number of die bondpads that a given number of leads can accommodate.

DETAILED DESCRIPTION OF PREFERRED EMBODIMENTS

Figure 1:
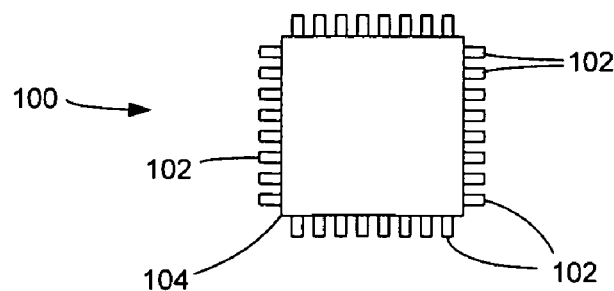
FIG. 1 is a top plan view of the exterior of a prior art Quad Flat Pack (QFP) IC package.
Figure 2:
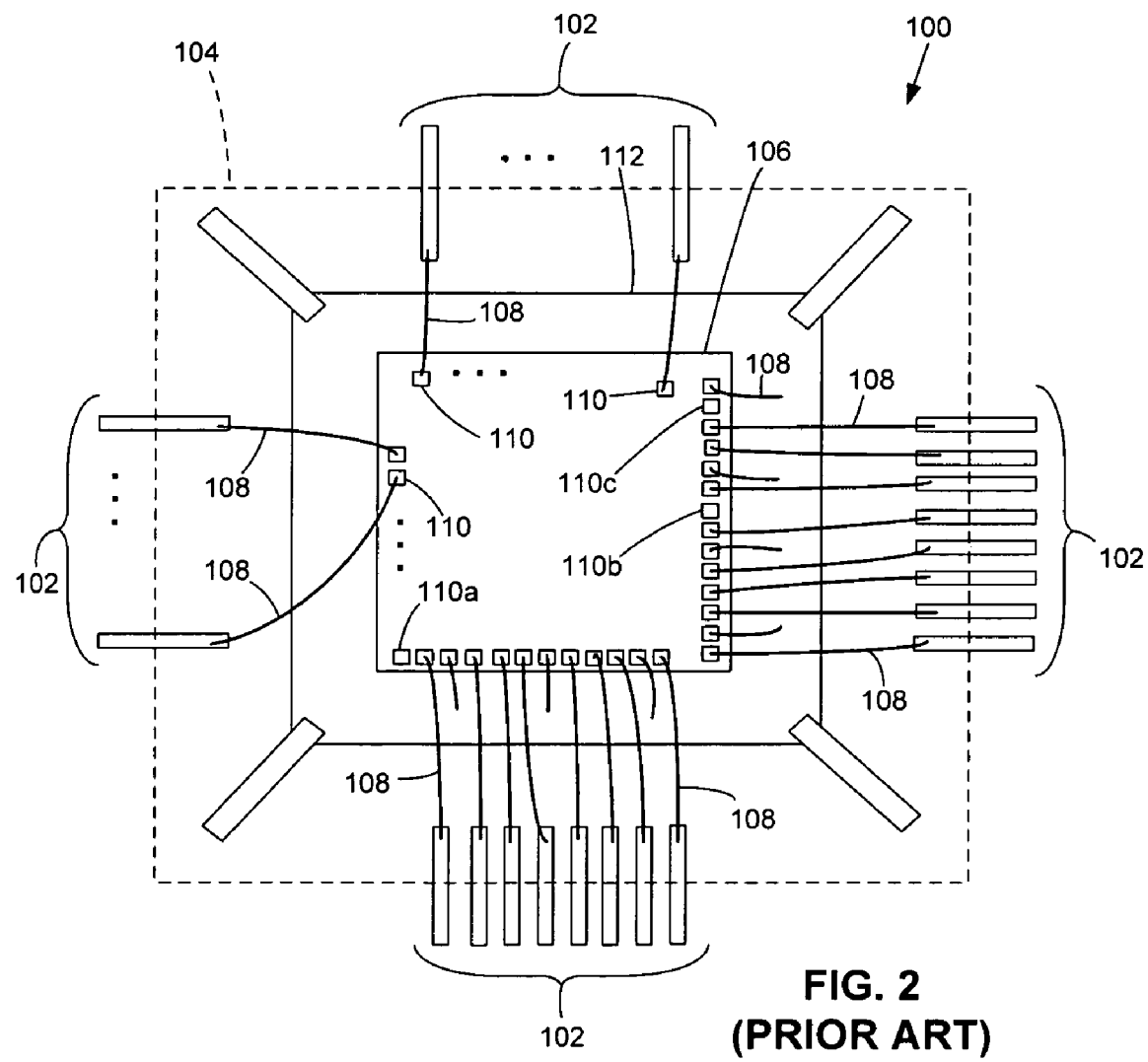
FIG. 2 is a generalized top plan view of the interior of the QFP package of FIG. 1.

In the following description, like reference numerals indicate like components to enhance the understanding of the invention through the description of the drawings. The drawing figures are not to scale. Also, although specific features, configurations, arrangements and steps are discussed below, it should be understood that such specificity is for illustrative purposes only. A person skilled in the relevant art will recognize that other features, configurations, arrangements and steps are useful without departing from the spirit and scope of the invention.

Figure 3:
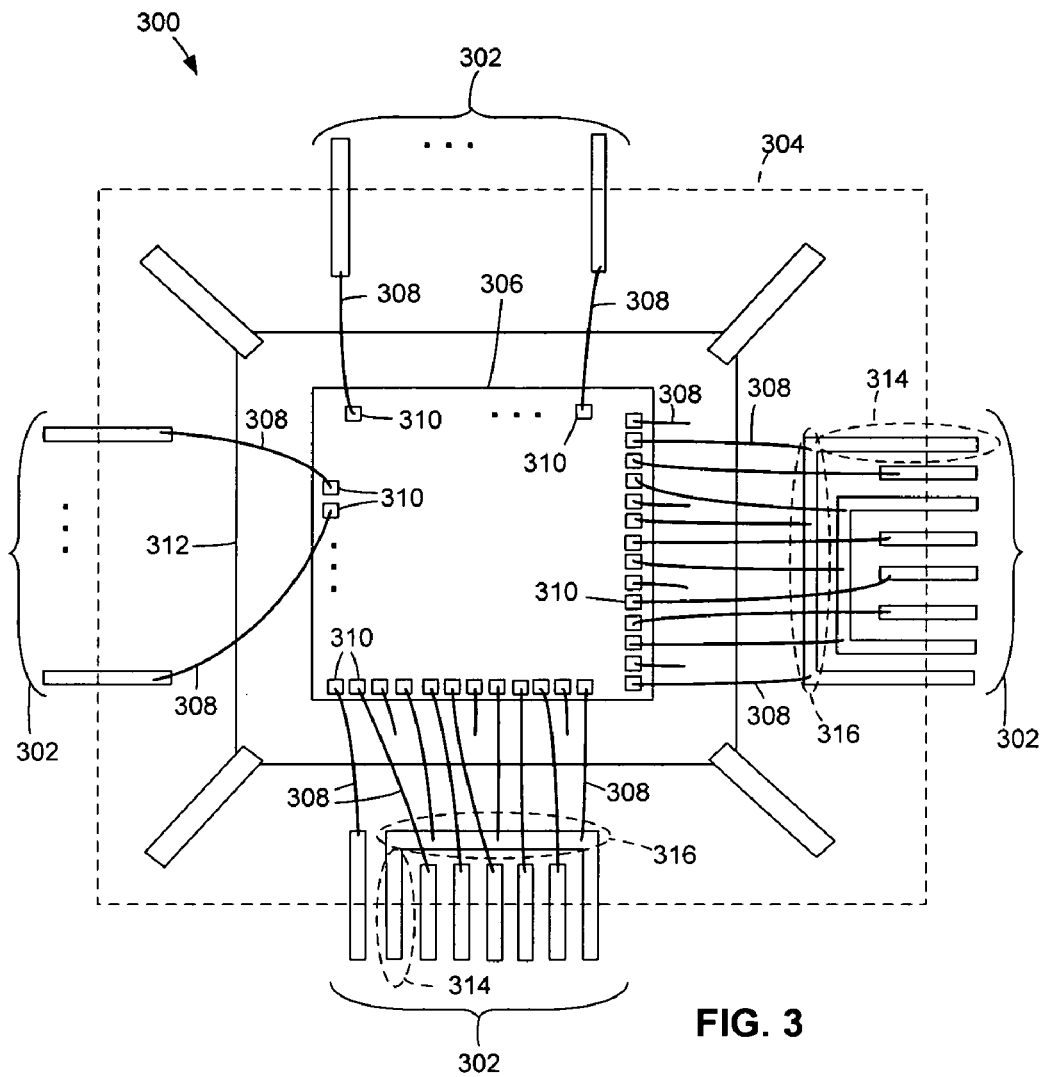
FIG. 3 is a generalized top plan view of the interior of a QFP package in accordance with an exemplary embodiment of the present invention.

As illustrated in FIG. 3, in an exemplary embodiment of the present invention, a Quad Flat Pack (QFP) package 300 has four sides with leads 302 extending from the component body 304 (shown in dashed line in this interior view) on all four sides. The electrical connections between the die 306 and the leads 302 of the package are made by wirebonding with bondwires 308. (Some leads 302 and other grouped elements are not shown individually for purposes of clarity, and their omission is indicated collectively by an ellipsis (" . . . ") symbol.) The first end of each bondwire 308 is attached to one of the bondpads 310 of die 306. The second end of each bondwire 308 is attached to either a lead 302 or a point on the diepaddle 312.

Each of leads 302 has an elongated lead portion 314 integrally formed with a lead tip 316. The elongated lead portions 314 are substantially parallel to one another and perpendicular to the edge of the component body 304 from which they extend. In other embodiments of the invention there can be additional leads that are not arranged in this manner.

Note that each of the two lead tips 316 encircled in dashed line for emphasis has an elongated or extended shape and essentially acts as an electrical bus to which a plurality of bondwires 308 are attached at points along its length. Note that each of those bondwires 308 is substantially perpendicular to the lead tip 316 at the point at which it is attached. The term "substantially perpendicular" is intended not to be limiting with geometric precision but rather only to evoke the bus-like structure, in which two or more bondwires 308 branch off from a lead tip 316 at points along its length in directions substantially at right angles (i.e., perpendicular) to the direction in which lead tip 316 extends, even though some or all bondwires 308 may deviate somewhat from precise right angle attachments.

Figure 4:
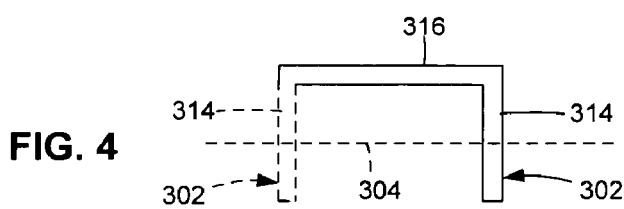
FIG. 4 illustrates a lead having an extended shape in accordance with the embodiment illustrated in FIG. 3.

As best illustrated by the solid-line portions of FIG. 4, a lead 302 can comprise a single elongated lead portion 314 integrally formed with a single lead tip 316, defining an L-shaped structure (or, similarly, a T-shaped structure, 7-shaped structure (not shown), etc.). Nevertheless, a lead tip 316 can also be integrally formed with more than one elongated lead portion 314, as in FIG. 3 (and, in FIG. 4 with the inclusion of the dashed-line portion). As illustrated in FIGS. 3 and 4, a U-shaped structure can be defined by two elongated lead portions 314 and a lead tip 316 extending between and perpendicular to them. The U-shaped structures can be nested, with one inside the other, as shown on the right side of package 300. The U-shaped structures define a type of looped lead or loop between leads, but as described below with regard to another embodiment of the invention, such loops can have shapes other than a "U".

Figure 5:
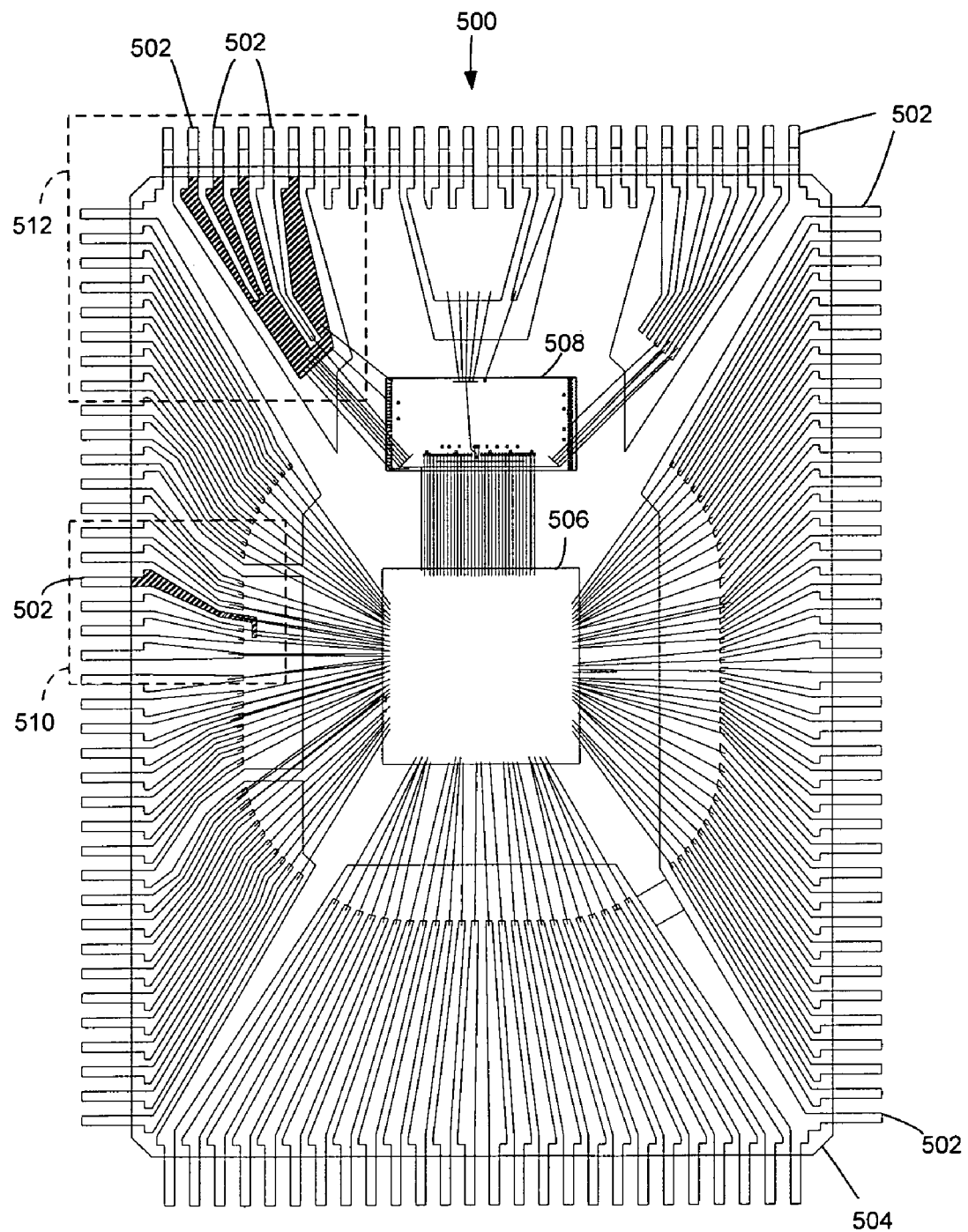
FIG. 5 is a generalized top plan view of the interior of a QFP package in accordance with another exemplary embodiment of the present invention.

As illustrated in FIG. 5, the invention can be very useful embodied as a System-In-Package (SIP), which is a complex type of QFP. A SIP includes two or more components within a package. The components can include not only one or more dies but also one or more other components, such as passive components, filters, amplifiers and other discrete circuit elements. The exemplary SIP 500 shown in FIG. 5 includes multiple leads 502 extending from four sides of the body 504, a die 506, and another component 508. The novel lead structures in two exemplary regions 510 and 512 (indicated in dashed line) are discussed below in further detail with regard to FIGS. 6 and 7, respectively. (The lead structures are shown with hatching in FIG. 5 for clarity and not to indicate a cross-sectional view or for other reasons.)

Figure 6:
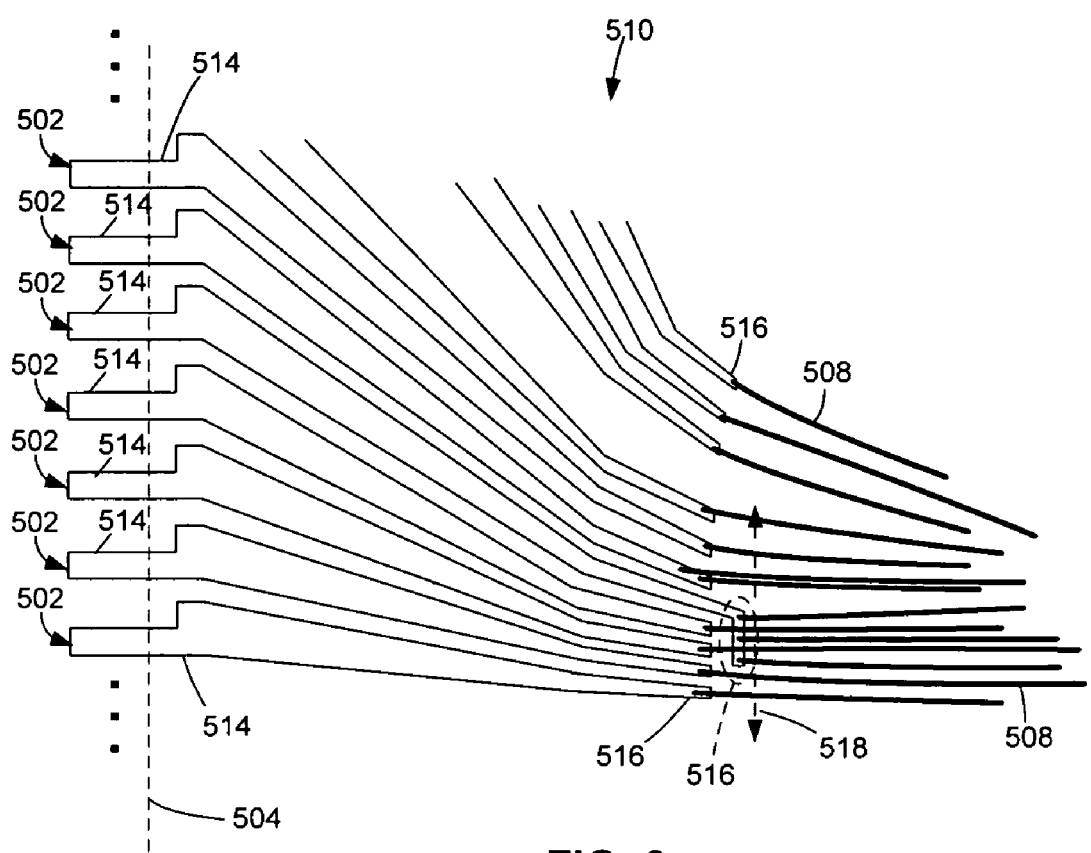
FIG. 6 is a detail view of a portion of FIG. 5.

As illustrated in FIG. 6, in region 510 (FIG. 5) the lead tip 516 of the lead 502 that is encircled in dashed line for emphasis has an extended shape and essentially acts as an electrical bus to which a plurality of bondwires 508 are attached at points along its length. Note that each of those bondwires 508 is substantially perpendicular to the lead tip 516 at the point at which it is attached. As noted above, the term "substantially perpendicular" is intended not to be limiting with geometric precision but rather only to evoke the bus-like structure, in which two or more bondwires 508 branch off from a lead tip 516 at points along its length in directions substantially at right angles (i.e., perpendicular) to the direction in which lead tip 516 extends, even though some or all bondwires 508 may deviate somewhat from precise right angle attachments. An axis 518, parallel to the distal edge of that lead tip 516 and thus oriented in the direction in which it extends, is shown for reference purposes.

As in the embodiment described above with regard to FIG. 3, each of leads 502 has an elongated lead portion 514 integrally formed with a lead tip 516. The elongated lead portions 514 are parallel to one another and perpendicular to the edge of the component body 504 from which they extend. Between each elongated lead portion 514 and lead tip 516 is the remaining or intermediate portion of that lead 502. Note that in the embodiment illustrated in FIGS. 5-7, this portion is actually longer than elongated lead portions 514, and some are bent or elbowed in one or more places for routing purposes. This portion is not critical to the present invention and can have any suitable shape and be routed in any suitable manner.

Figure 7:
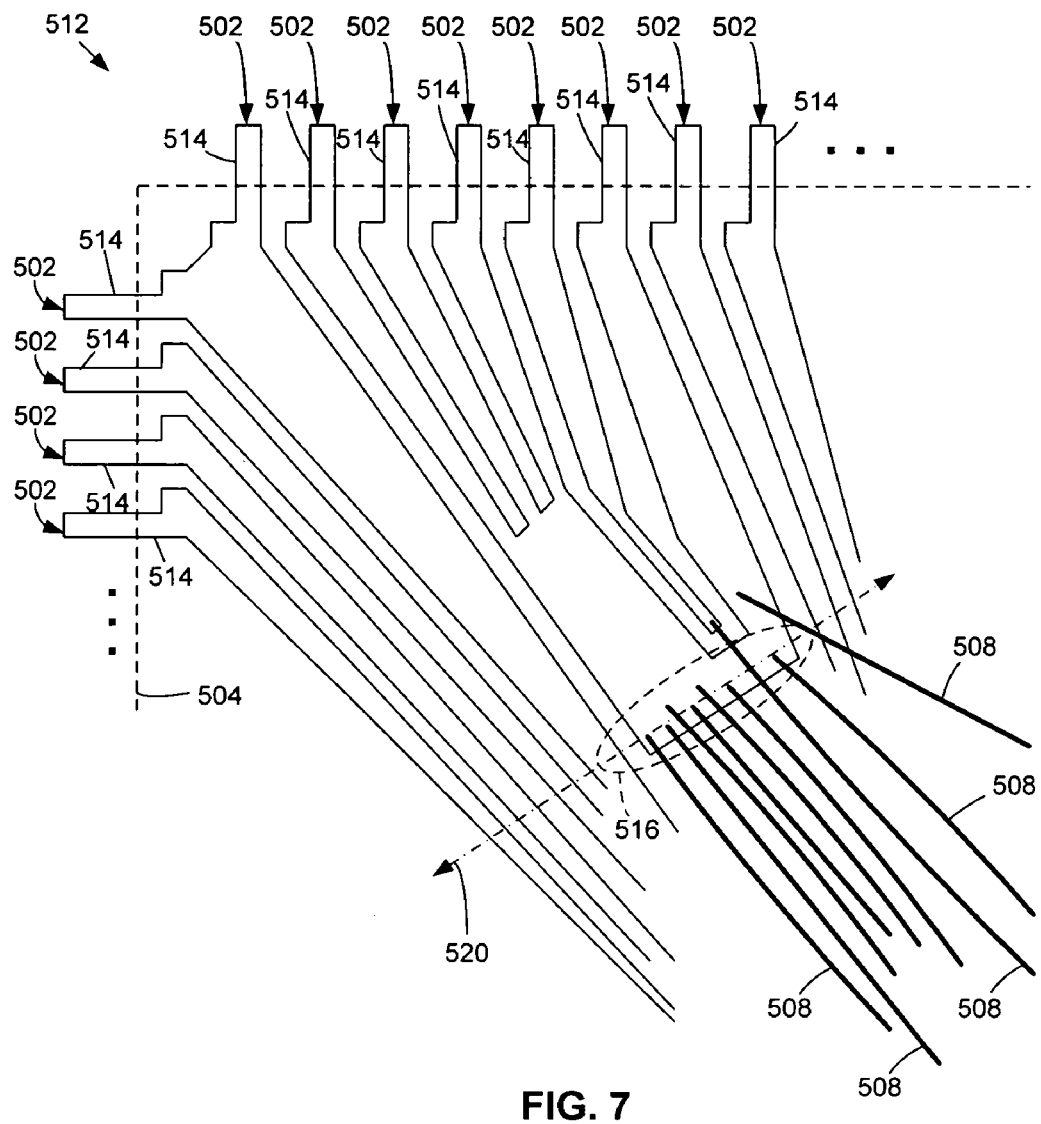
FIG. 7 is a detail view, similar to FIG. 6, of another portion of FIG. 5.

As illustrated in FIG. 7, in region 512 (FIG. 5) a lead tip 516 (encircled in dashed line for emphasis) similarly has an extended shape and essentially acts as an electrical bus to which a plurality of bondwires 508 are attached at points along its length. An axis 520, parallel to the distal edge of that lead tip 516 and thus oriented in the direction in which it extends, is shown for reference purposes. Note that each of those bondwires 508 is substantially perpendicular to the lead tip 516 at the point at which it is attached. As FIGS. 5-7 should suggest to those skilled in the art, a lead tip 516 can have essentially any suitable shape that allows two or more bondwires 508 to be attached to it in a bus-like manner along its length.

Note that the lead tip 516 to which the plurality of bondwires 508 are attached is integrally formed with four elongated lead portions 514. A loop structure, analogous to the U-shaped structure described above with regard to FIG. 3, can be defined by any two of those elongated lead portions 314 and the portion of lead tip 316 extending between them. In the U-shaped structure described above, the right angles between the elongated lead portions 314 and the lead tip 316 characterize the loop as U-shaped. Nevertheless, a loop structure can have any other suitable shape, such as the irregular comb-like shape of FIG. 7 in which four finger-like portions extend toward lead tip 516. In view of the teachings herein, other such loop structures will readily occur to those skilled in the art.

It will be apparent to those skilled in the art that various modifications and variations can be made to this invention without departing from the spirit or scope of the invention. For example, although in the illustrated embodiments of the invention the IC package is a QFP, the invention can be embodied in other suitable package types. Thus, it is intended that the present invention cover all modifications and variations of this invention that come within the scope of one or more claims and their equivalents. With regard to the claims, no claim is intended to invoke the sixth paragraph of 35 U.S.C. Section 112 unless it includes the term "means for" followed by a participle.

What is claimed is:

1. An integrated circuit (IC) package, comprising:
   a semiconductor die having a plurality of bondpads;
   a plurality of leads, each having an elongated lead portion and a lead tip, the elongated lead portion being substantially parallel to the elongated lead portion of all other leads of the plurality and substantially perpendicular to an edge of the package; and
   a plurality of bondwires, each bondwire having a first end attached to a bondpad and a second end attached to a lead tip, and wherein at least one lead tip is substantially perpendicular to at least two bondwires connected to the at least one lead tip;
   wherein a first lead tip is included in a first loop between a first lead and a second lead, a second lead tip is included in a second loop between a third lead and a fourth lead, and the first loop is nested within the second loop.

2. The IC package claimed in claim 1, wherein a lead tip extends perpendicularly from the elongated lead portion and is attached to the second ends of the at least two bondwires.

3. The IC package claimed in claim 1, wherein the first ends of the at least two bondwires are attached to bondpads that are not adjacent to one another, and at least one other bondwire is interposed between the at least two bondwires.

4. The IC package claimed in claim 1, wherein at least a portion of the first lead tip is parallel to at least a portion of the second lead tip.

5. The IC package claimed in claim 1, wherein:
   the first lead tip extends perpendicularly from the elongated lead portion of the first lead and the elongated lead portion of the second lead; and
   the second lead tip extends perpendicularly from the elongated lead portion of the third lead and the elongated lead portion of the fourth lead.

6. An integrated circuit (IC) package, comprising:
   a semiconductor die having a plurality of bondpads;
   a plurality of leads, each having an elongated lead portion and a lead tip, wherein a first lead tip is included in a first loop between a first lead and a second lead; and
   a plurality of bondwires, each bondwire having a first end attached to a bondpad and a second end attached to a lead tip, the second ends of at least two bondwires being attached to a first lead tip;
   wherein a second lead tip is included in a second loop between a third lead and a fourth lead, and the first loop is nested within the second loop.

7. The IC package claimed in claim 6, wherein the first ends of the at least two bondwires are attached to bondpads that are not adjacent to one another, and at least one other bondwire is interposed between the at least two bondwires.

8. The IC package claimed in claim 6, wherein at least a portion of the first lead tip is parallel to at least a portion of the second lead tip.

* * * * *